(12) United States Patent
Shirley et al.

(10) Patent No.: US 7,088,604 B2
(45) Date of Patent: Aug. 8, 2006

(54) MULTI-BANK MEMORY

(75) Inventors: Brian M. Shirley, Boise, ID (US); David R. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,586

(22) Filed: Mar. 15, 2001

(65) Prior Publication Data

US 2002/0131315 A1    Sep. 19, 2002

(51) Int. Cl.
*G11C 5/02* (2006.01)
*G11C 5/06* (2006.01)

(52) U.S. Cl. .................. 365/51; 365/63; 365/203.03

(58) Field of Classification Search ............ 365/230.03, 365/205, 207, 208, 51, 52, 63
See application file for complete search history.

(56) References Cited

U.S. PATENT DOCUMENTS

| | | | | |
|---|---|---|---|---|
| 5,159,572 A * | 10/1992 | Morton | .................. | 365/230.03 |
| 5,274,788 A * | 12/1993 | Koike | .................. | 365/230.03 |
| 5,642,323 A * | 6/1997 | Kotani et al. | .......... | 365/230.03 |
| 5,970,016 A * | 10/1999 | Ohsawa | ................ | 365/230.03 |
| 5,973,991 A * | 10/1999 | Tsuchida et al. | ....... | 365/230.03 |
| 6,067,270 A * | 5/2000 | Hwang | ................. | 365/230.03 |
| 6,097,660 A * | 8/2000 | Tsuchida et al. | ....... | 365/230.03 |
| 6,134,172 A * | 10/2000 | Barth et al. | ............ | 365/230.03 |
| 6,166,986 A * | 12/2000 | Kim | ..................... | 365/230.03 |
| 6,310,814 B1 * | 10/2001 | Hampel et al. | ........ | 365/230.03 |
| 6,310,817 B1 * | 10/2001 | Kablanian | ............. | 365/230.03 |
| 6,335,875 B1 * | 1/2002 | Ooishi | ................... | 365/230.03 |
| 6,418,077 B1 * | 7/2002 | Naven | .................. | 365/230.03 |

OTHER PUBLICATIONS

"Rambus Direct RDRAM 128/144-Mbit (256kx16/18x32s) Preliminary Information", Document DL0059, V1.11, (Jun. 2000), pp. 1-66.

"Rambus Direct RDRAM 256/288-Mbit (1Mx16/18x16d) Preliminary Information", Document DL 0105, V1.1, (Aug. 2000), pp. 1-72.

* cited by examiner

*Primary Examiner*—Trong Phan
(74) *Attorney, Agent, or Firm*—Schwegman, Lundberg, Woessner & Kluth, P.A.

(57) ABSTRACT

A multi-bank memory device includes rows and columns of memory cores. Each row includes memory cores from one bank interleaved with memory cores from another bank. Banks in different rows can be simultaneously accessed.

59 Claims, 5 Drawing Sheets

MULTI-BANK MEMORY

TECHNICAL FIELD OF THE INVENTION

The present invention relates generally to memory devices, and in particular, the present invention relates to memory devices having multiple banks.

BACKGROUND OF THE INVENTION

Direct Rambus Dynamic Random Access Memories, hereinafter referred to as DRDRAMs, are very fast, highly pipelined memory devices that are becoming an industry standard in high speed processing systems. DRDRAMs include a considerable amount of internal circuitry that supports the pipelined architecture so as to provide for very high communication bandwidths at the device boundary. DRDRAM sustained data transfer rates exceed 1 GB/s.

DRDRAMs, like most commercially available memories, include memory cells that are arranged in rows and columns. Unlike many commercially available memories, however, DRDRAMs are multi-bank devices that have memory cells logically arranged into banks that can be independently accessed. This results in multiple banks within each DRDRAM, each including a number of memory cells. Gathering the memory cells into banks, and allowing different banks to undergo separate operations simultaneously, increases the overall data transfer rate of the device.

Each bank is associated with one or more sense amplifiers that function to read data from, and write data to, the memory cells within the bank. The sense amplifiers serve as a data communications bridge between the banks of memory cells and the data buses external to the device. Banks are separately activated, possibly simultaneously, or overlapping in time, prior to a read or write operation. When a bank is activated, it communicates with one or more sense amplifiers. When the read or write operation is complete, the bank is deactivated, and the sense amplifiers are precharged, which readies the sense amplifiers for another operation.

Examples of DRDRAMs are described in: "Rambus Direct RDRAM 128/144-Mbit (256 k×16/18×32s) Preliminary Information," Document DL0059, V1.11, June 2000; and "Rambus Direct RDRAM 256/288-Mbit (1M×16/18× 16d) Preliminary Information," Document DL0105, V1.1, August 2000. The contents of the aforementioned documents are hereby incorporated by reference.

FIG. 1 shows a prior art multi-bank memory device. Memory device 100 includes memory cells arranged in rows and columns. Each column is shown as a vertical strip of memory cells, and each row is shown as a horizontal strip of memory cells. For example, strip 102 is a column that includes memory cells 120, 124, and 128, and strip 104 is a column that includes memory cells 130, 134, and 138. In memory device 100, each column corresponds to a single bank of memory cores. For example, memory cores 120, 124, and 128 of strip 102 are part of Bank 0, and memory cores 130, 134, and 136 of strip 104 are part of Bank 1. As shown in FIG. 1, memory device 100 is arranged into "n" banks labeled Bank 0 through Bank (n−1).

Each bank shares sense amplifiers with at least one other bank. For example, sense amplifiers 140, 142, and 144 are shared between memory cores in Bank 0 and memory cores in Bank 1, and sense amplifiers 146, 148, and 150 are shared between memory cores in Bank 1 and memory cores in Bank 2.

Local row decoders are arranged within the array of memory cores. Each local row decoder provides wordline addressing to memory cores in close proximity. For example, in FIG. 1, each of row decoders 122 and 126 provide row decoding for one or more of the memory cores in strip 102.

Column decoding, in contrast to row decoding, is performed globally. Column decode lines driven by column decoders typically traverse an entire row of memory cores, rather than only memory cores nearby. For example, column decoder 110 drives column decode lines 160 shown schematically in FIG. 1 as an arrow. One or more of column decode lines 160 traverse multiple memory cells of the row to enable sense amplifiers within the row across from the column decoder. For example, a column decode line that enables sense amplifiers 146 to read from memory core 131 in Bank 2 will typically travel over, under, or past memory cores 120 and 130 from Banks 0 and 1, respectively.

In memory devices that allow simultaneous access to multiple banks, such as DRDRAMs, column decode lines that traverse memory cores from multiple banks can be problematic, in part because column decode lines addressed to one bank can cause electrical noise in memory cores of other banks being accessed. If noise is great enough, data errors can result.

FIG. 2 shows a prior art sense amplifier suitable for use in a multi-bank memory. Sense amplifier 200 includes N-sense amplifier 202 and P-sense amplifier 204 coupled between sense nodes 232 and 234, isolation transistors 206A, 206B, 208A, and 208B, column decode transistors 210 and 212, and bank select transistors 216 and 218. Sense nodes 232 and 234 are coupled to input output (I/O) lines 224 and 222 through the column decode and bank select transistors. A column decode signal (Y-GATE) on node 214 is coupled to column decode transistors 210 and 212, and a bank select signal (BANK) on node 220 is coupled to bank select transistors 216 and 218. Other column decode lines 230 driven by the column decoder 110 (FIG. 1) pass nearby sense amplifier 200. Other column decode lines 230 are coupled to other sense amplifiers (not shown) in the same manner that Y-GATE is coupled to sense amplifier 200 on node 214.

The operation of sense amplifier 200 is well known. When data from a memory core either to the left or right of sense amplifier 200 is to be read, the appropriate isolation transistors are turned on by either signal ISOL or ISOR, and the N-sense and P-sense amplifiers are activated using signals NLAT and ACT, respectively. The data value (and its complement) being read appears on sense nodes 232 and 234. When both the column decode signal (Y-GATE) on node 214 and the bank select signal (BANK) on node 220 are asserted, transistors 210, 212, 216, and 218 turn on and couple sense amplifier 200 to I/O lines 222 and 224.

When sense amplifier 200 is used in a multi-bank memory device that allows simultaneous operations among banks, the other column decode lines 230 can be actively changing during the operation of sense amplifier 200, causing noise that can potentially cause a data error. For example, referring now back to FIG. 1, if sense amplifier 140 is sensing data from memory core 120 in bank 0 while a column decode line addressing sense amplifier 146 is changing, a data error in sense amplifier 140 can result. As memory devices become larger, and more banks are added, the problem becomes worse.

For the reasons stated above, and for other reasons stated below which will become apparent to those skilled in the art upon reading and understanding the present specification, there is a need in the art for alternate multi-bank memory devices.

SUMMARY OF THE INVENTION

The above mentioned problems and other problems are addressed by the present invention and will be understood by reading and studying the following specification.

In one embodiment, a memory device includes a plurality of banks, each including a plurality of memory cores, and also includes a plurality of sense amplifiers shared among memory cores of different ones of the plurality of banks. The memory cores from two of the different ones of the plurality of banks are interleaved in a strip with the plurality of shared sense amplifiers.

In another embodiment, an integrated circuit includes an array of memory cores having a first dimension and a second dimension, where a strip of memory cores in the first dimension includes memory cores from a first bank interleaved with memory cores from a second bank. In this embodiment, a plurality of sense amplifiers are arranged between memory cores from the first bank and memory cores from the second bank.

In another embodiment, a computer system includes a processor and a memory device coupled to the processor. The memory device includes a plurality of rows and columns of memory cores, and also includes a plurality of sense amplifiers positioned between memory cores within each row, wherein every other memory core within each row is assigned to a bank.

DETAILED DESCRIPTION OF THE INVENTION

Figure 1:
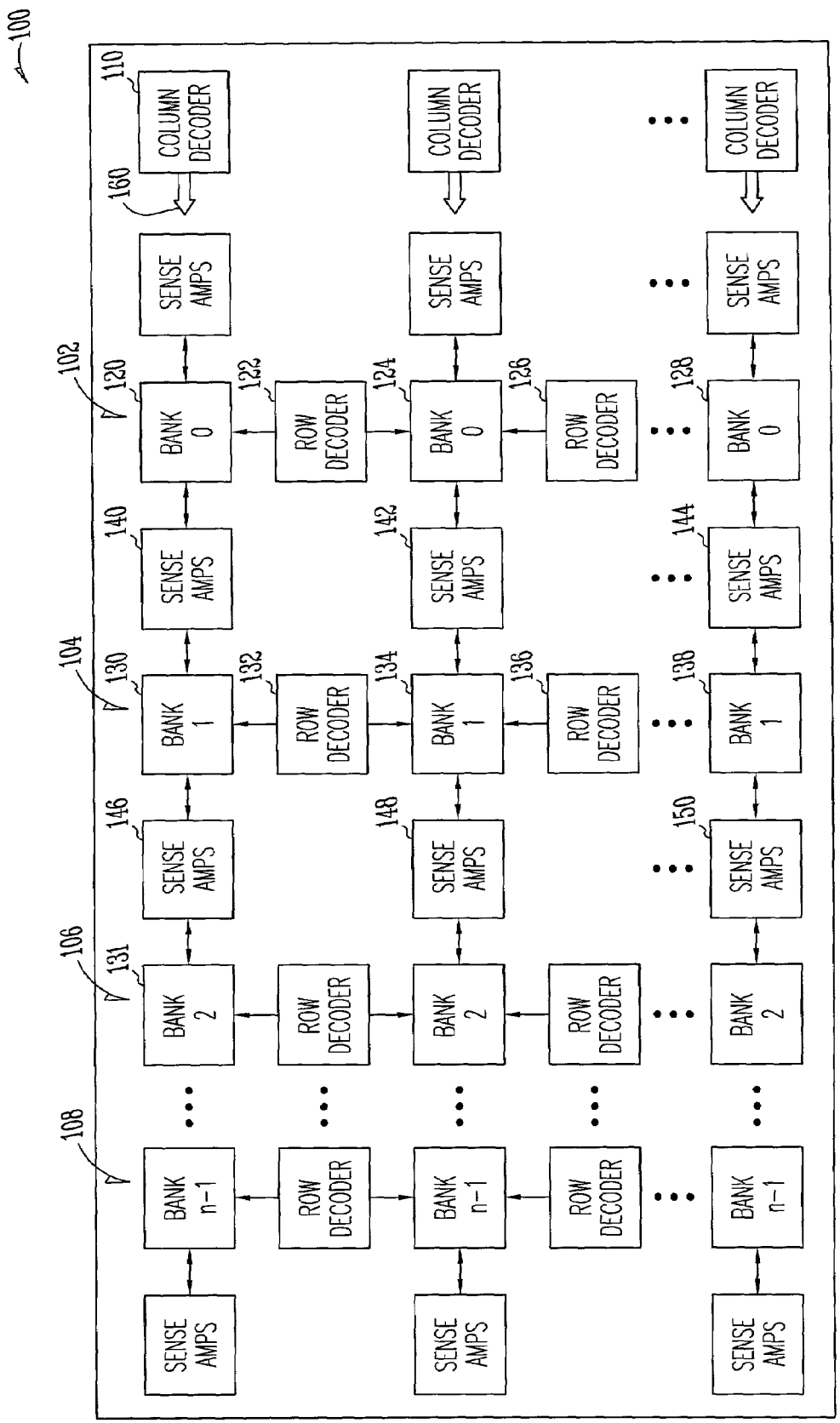
FIG. 1 is a diagram of a prior art multi-bank memory device.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 3:
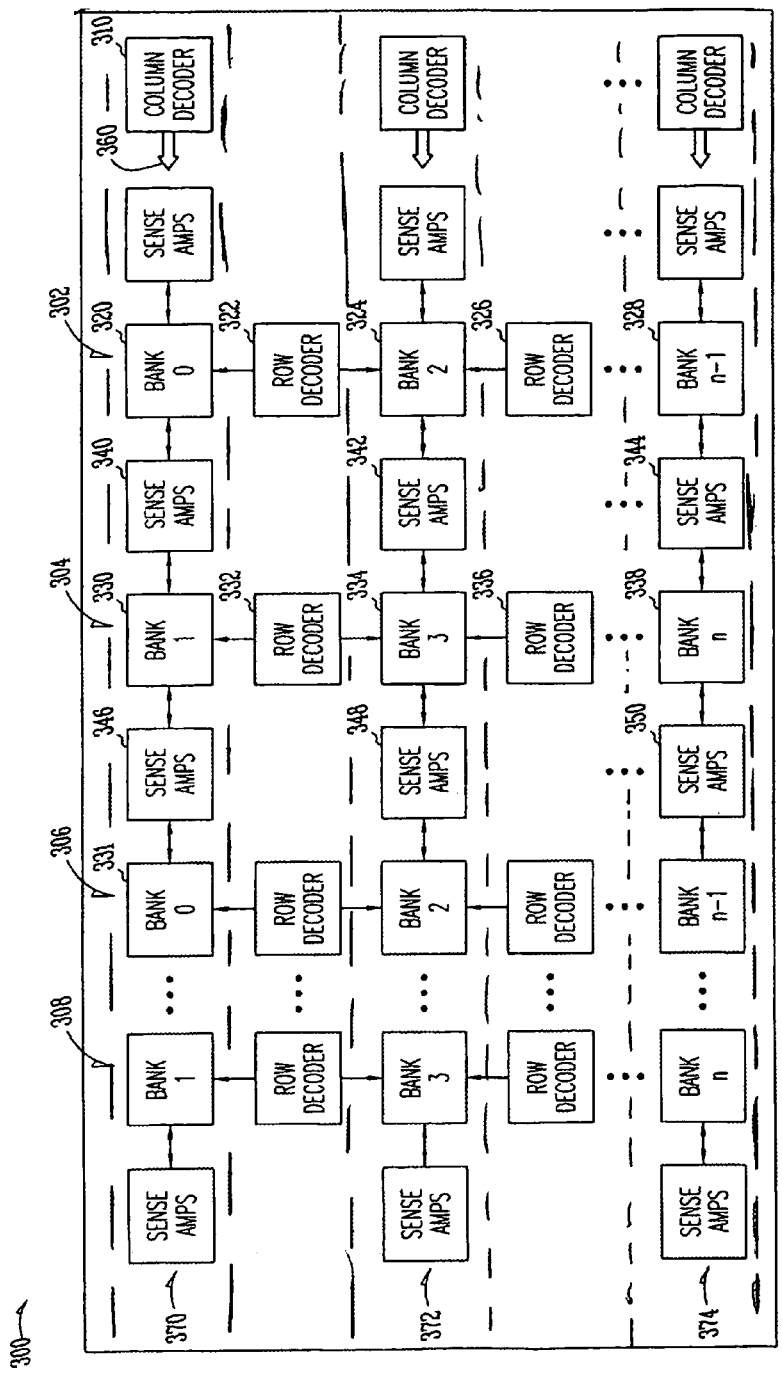
FIG. 3 is a diagram of a multi-bank memory device of the present invention.

FIG. 3 shows a multi-bank memory device in accordance with the present invention. Memory device 300 includes memory cells arranged in rows and columns. Each column is shown as a vertical strip of memory cells, and each row is shown as a horizontal strip of memory cells. For example, strip 302 is a column that includes memory cells 320, 324, and 328, and strip 370 is a row that includes memory cells 320 and 330. As shown in FIG. 1, memory device 100 is arranged into "n" banks labeled Bank 0 through Bank (n−1).

Each row in memory device 300 includes memory cores from two banks interleaved together. For example, strip 370 includes memory cores from Bank 0 and Bank 1 alternating across the strip. Also for example, strip 372 includes memory cores from Bank 2 interleaved with memory cores from Bank 3.

Each row includes sense amplifiers that are shared between two banks of memory cores. For example, sense amplifiers 340 and 346 are shared between memory cores in Bank 0 and memory cores in Bank 1, and sense amplifiers 342 and 348 are shared between memory cores in Bank 2 and memory cores in Bank 3.

Local row decoders are arranged within the array of memory cores. Each local row decoder provides wordline addressing to memory cores in close proximity. For example, in FIG. 3, each of row decoders 322 and 326 provide row decoding for one or more of the memory cores in strip 302. In some embodiments, row decoders are shared among multiple memory cores, with latches and row drivers dedicated to each bank. For example, in the embodiment of FIG. 3, row decoders can be shared between Bank 0 and Bank 2. In operation, each of these row decoders performs a row decode operation, and the result is steered into a latch for Bank 0 or a latch for Bank 2.

Column decode lines driven by column decoders typically traverse an entire row of memory cores, rather than only memory cores nearby. For example, column decoder 310 drives column decode lines 360 shown schematically in FIG. 3 as an arrow. One or more of column decode lines 360 traverse multiple memory cells of the row to enable sense amplifiers within the row across from the column decoder. For example, a column decode line that enables sense amplifiers 346 to read from memory core 331 in Bank 0 will typically travel over, under, or past memory cores 320 and 330 from Banks 0 and 1, respectively.

Multi-bank memory device 300 is useful in part because each row includes memory cores from banks that cannot be simultaneously accessed. For example, memory cores from Bank 0 and Bank 1 are interleaved in a single row. Because memory cores from Bank 0 and Bank 1 share sense amplifiers, they cannot be simultaneously accessed. Banks in other rows, however, may be accessed at the same time or overlapping in time with an access of memory cores in Bank 0 or Bank 1. Each row has at least one column decoder dedicated thereto. For example, row 370 has column decoder 310 dedicated thereto. Because each row supports only one access at a time, column decode lines driven by each column decoder change only during an access to that particular row, and the noise problem associated with memory device 100 (FIG. 1) is avoided.

Multi-bank memory device 300 is arranged as a two dimensional array of memory cores. One dimension of the array includes strips of memory cores, each strip having interleaved memory cores from two separate banks. The other dimension of the array contains strips that do not include memory cores from common banks. In the embodiment shown in FIG. 3, each strip that includes interleaved memory cores from two banks is situated in a a row, and strips that do not include memory cores from common banks are situated in columns. In other embodiments, columns include interleaved memory cores rather than rows.

Figure 4:
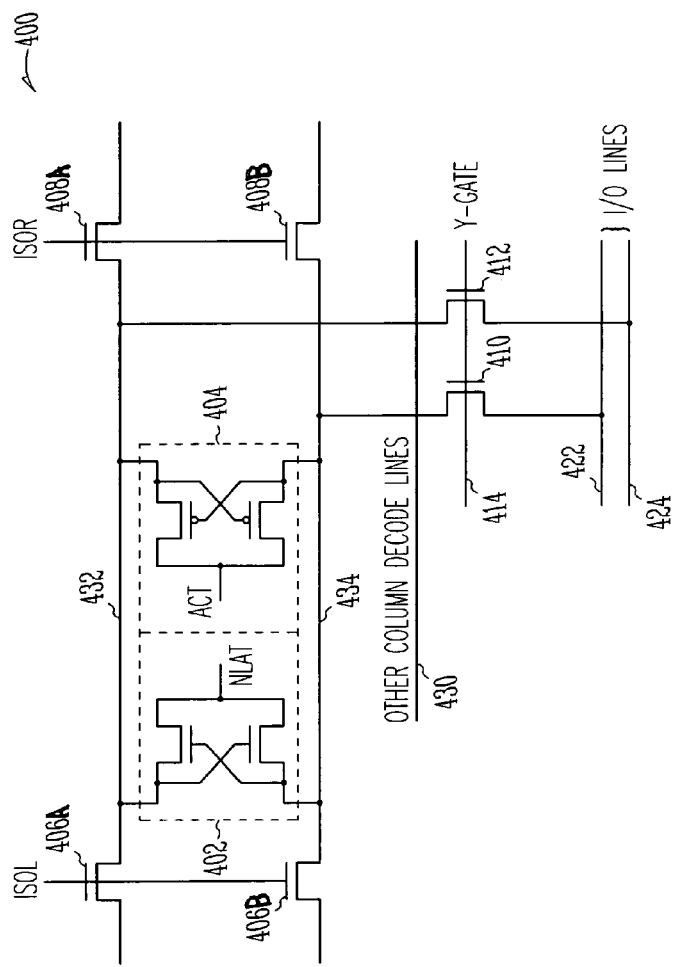
FIG. 4 is a diagram of a sense amplifier in accordance with the present invention.

FIG. 4 shows a sense amplifier in accordance with the present invention. Sense amplifier 400 includes N-sense amplifier 402 and P-sense amplifier 404 coupled between sense nodes 432 and 434, isolation transistors 406A, 406B, 408A, and 408B, and column decode transistors 410 and 412. Sense nodes 432 and 434 are coupled to input output (I/O) lines 424 and 422 through the column decode transistors. A column decode signal (Y-GATE) on node 414 is coupled to column decode transistors 410 and 412.

Other column decode lines 430 driven by the column decoder pass nearby sense amplifier 400. Other column decode lines 430 are coupled to other sense amplifiers (not shown) in the same manner that Y-GATE is coupled to sense amplifier 400 on node 414. Because each row includes interleaved memory cores from two banks, the sense amplifiers in the same row as sense amplifier 400 access memory cores from the same two banks as sense amplifier 400. As a result, other column decode lines 430 are not changing when sense amplifier 400 is sensing.

In operation, when data from a memory core either to the left or right of sense amplifier 400 is to be read, the appropriate isolation transistors are turned on by either signal ISOL or ISOR, and the N-sense and P-sense amplifiers are activated using signals NLAT and ACT, respectively. The data value (and its complement) being read appears on sense nodes 432 and 434. When the column decode signal (Y-GATE) on node 414 is asserted, transistors 410 and 412 turn on and couple sense amplifier 400 to I/O lines 422 and 424.

Figure 2:
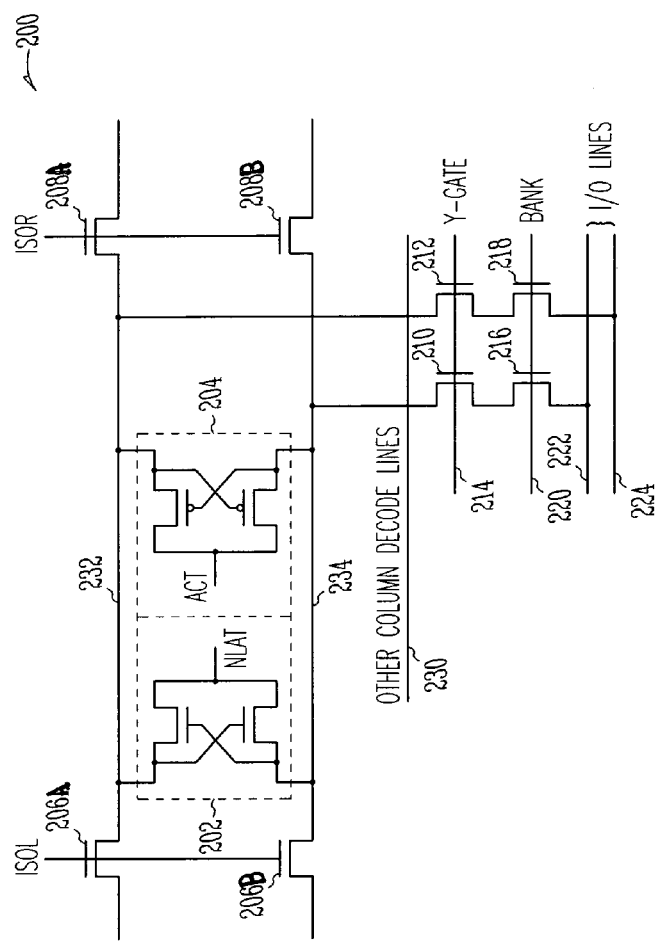
FIG. 2 is a diagram of a prior art sense amplifier.

Sense amplifier 400 does not include bank select transistors such as bank select transistors 216 and 218 (FIG. 2). This is because each row only includes memory cores from two banks that cannot be simultaneously accessed, and there is no need to identify which bank is being accessed with a bank decode signal. As a result, sense amplifier 400 can be made significantly smaller than sense amplifier 200 (FIG. 2).

Node 414 and other column decode lines 430 are conductors that run substantially parallel to a row of memory cores and sense amplifiers. For example, referring now back to FIG. 3, column decode lines 160 run substantially parallel to row 370. The conductors can be made from metal, poly, or any other suitable material. For example, in a two-layer metal process, the column decode lines can be dedicated to a single metal layer. Also for example, in a single layer metal process, the column decode lines can be buried on poly layers.

Figure 5:
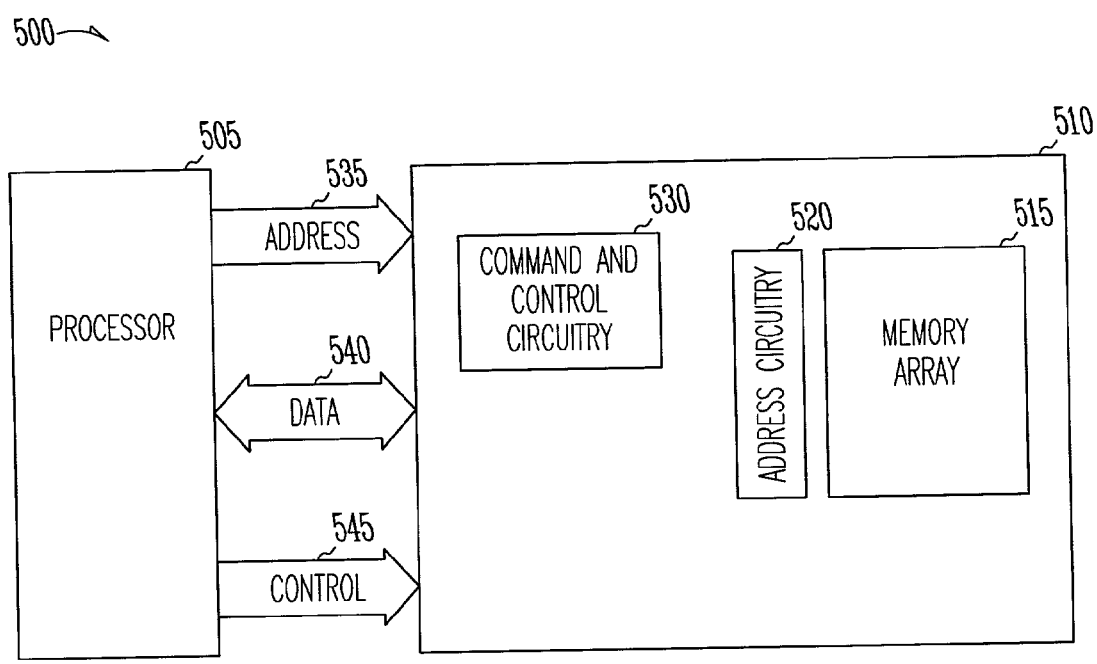
FIG. 5 is a diagram of a processing system in accordance with the present invention.

FIG. 5 is a diagram of a processing system in accordance with the present invention. System 500 includes processor 505 and memory device 510. Memory device 510 includes memory array 515, address circuitry 520, and read circuitry 530, and is coupled to processor 505 by address bus 535, data bus 540, and control bus 545. Memory array 515 includes memory cells and circuits arranged in accordance with those embodiments discussed above with reference to FIGS. 3 and 4.

Memory device 510 is typically mounted on a motherboard. Processor 505, through address bus 535, data bus 540, and control bus 545 communicates with memory device 510. In a read operation initiated by processor 505, address information, data information, and control information are provided to memory device 510 through busses 535, 540, and 545. This information is decoded by addressing circuitry 520 and read circuitry 530. Successful completion of the read operation results in information from memory array 515 being communicated to processor 505 over data bus 540.

CONCLUSION

A multi-bank memory device has been described that includes rows and columns of memory cores. Each row includes memory cores from one bank interleaved with memory cores from another bank. Banks in different rows can be simultaneously accessed without noise coupling from one access to the other.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   a plurality of banks, each bank including a plurality of memory core blocks that are selected for activation or deactivation together, the memory core blocks arranged in a plurality of first strips and second strips, the second strips orthogonal to the first strips, a first one of the first strips including a all memory core blocks from a first memory bank and all memory core blocks from a second memory bank, the memory core blocks from the first and second banks being interleaved in the first one of the first strips row in an alternating fashion; and
   a plurality of sense amplifiers shared between and interleaved, in the first one of the first strips, with the memory core blocks of the first and second memory banks.

2. The memory device of claim 1 wherein column decode conductors traverse the memory core blocks in the first one of the first strips.

3. The memory device of claim 2 further comprising sense nodes substantially parallel to the column decode conductors.

4. The memory device of claim 1 wherein each one of the first strips interleaves all memory core blocks from two different banks.

5. A memory device comprising:
   a plurality of memory cores logically arranged into a plurality of banks, each bank selectably activating or deactivating its memory cores together as a group, with each memory core assigned to a unique one of the memory banks, and the memory cores are arranged into a plurality of first strips and second strips, wherein the second strips are orthogonal to the first strips, and with each memory core in a first one of the second strips being associated with a different one of the banks;
   a plurality of sense amplifiers, each sense amplifier being shared between two unique memory cores in a first one of the first strips, wherein the two unique memory cores are from different banks; and
   wherein the memory cores in a first one of the first strips are arranged in an alternating fashion of two different banks with a sense amplifier between adjacent memory cores in the first one of the first strips.

6. The memory device of claim 5 further comprising column decode conductors for the first one of the first strips, the column decode conductors for the first one of the first strips being coupled to all the sense amplifiers in the first one of the first strips.

7. The memory device of claim 5 wherein the first one of the first strips includes all memory cores from a first one of the banks.

8. The memory device of claim 5 wherein the first one of the first strips includes all memory cores from a first one of the banks and all memory cores from a second one of the banks.

9. A memory device comprising:
a first bank of memory cores arranged in a linear strip and selectable for activation and deactivation together as a first group;
a second bank of memory cores interleaved in the linear strip with memory cores of the first bank, the second bank of memory cores selectable for activation and deactivation together as a second group; and
a plurality of sense amplifiers shared between memory cores of the first bank and memory cores of the second bank along the linear strip, the strip comprising only those memory cores from the first and second banks.

10. The memory device of claim 9 further comprising a plurality of memory cores arranged as horizontal strips and a plurality of memory cores of vertical strips arranged perpendicular to the horizontal strips, wherein the linear strip is one of the plurality of horizontal strips.

11. The memory device of claim 10 wherein each of the plurality of horizontal strips includes interleaved memory cores from two different banks.

12. The memory device of claim 9 wherein each of the plurality of sense amplifiers is coupled to one memory core of the first bank and one memory core of the second bank.

13. A memory device comprising:
a first bank of memory cores arranged in a strip that includes all of the memory cores in the first bank, the first bank of memory cores selectable for activation and deactivation together as a first group;
a second bank of memory cores interleaved with the first bank of memory cores arranged in the strip that includes all of the memory cores in the second bank, the second bank of memory cores selectable for activation and deactivation together as a second group independently from the first group;
a plurality of sense amplifiers shared between memory cores of the first bank and memory cores of the second bank; and
a column decoder arranged to drive column decode lines coupled to the plurality of sense amplifiers.

14. The memory device of claim 13 further comprising a plurality of memory cores arranged in horizontal strips and a plurality of memory cores arranged in vertical strips arranged perpendicular to the horizontal strips, wherein the strip is one of the plurality of horizontal strips.

15. The memory device of claim 14 wherein each of the plurality of horizontal strips includes interleaved memory cores from only two different banks.

16. The memory device of claim 13 wherein each of the plurality of sense amplifiers is coupled to one memory core of the first bank and one memory core of the second bank.

17. An integrated circuit comprising:
an array of memory cores arranged as rows along a first dimension and arranged as columns along a second dimension; and
wherein a strip of memory cores in the first dimension includes all of the memory cores from a first bank interleaved with all of the memory cores from a second bank interspersed with shared sense amplifiers between memory cores of different banks, wherein each particular bank is selectable to activate or deactive all of the memory cores associated with the particular bank.

18. The integrated circuit of claim 17 wherein the first dimension includes a plurality of horizontal strips of memory cores, and the second dimension includes a plurality of vertical strips of memory cores, and each of the plurality of horizontal strips includes interleaved memory cores from two different banks.

19. The integrated circuit of claim 18 wherein each of the plurality of vertical strips includes non-interleaved memory cores from different banks, and each memory core in a particular vertical strip is from a different bank than the other memory cores in that same particular vertical strip.

20. The integrated circuit of claim 17 further comprising:
a column decoder; and
a plurality of column decode conductors driven by the column decoder and situated substantially parallel to the strip of memory cores.

21. An integrated circuit comprising:
an array of memory cores, the array having a first dimension and a second dimension, wherein a strip of memory cores in the first dimension includes all of the memory cores from a first bank interleaved with all of the memory cores from a second bank, wherein each bank is selectable to activate or deactivate all of the memory cores in that bank; and
a plurality of sense amplifiers arranged between memory cores from the first bank and memory cores from the second bank.

22. The integrated circuit of claim 21 wherein:
the first dimension includes a plurality of horizontal strips of memory cores;
the second dimension includes a plurality of vertical strips of memory cores; and
each of the plurality of horizontal strips interleaves all of the memory cores from two different banks.

23. The integrated circuit of claim 22 wherein each of the plurality of vertical strips includes non-interleaved memory cores, and in which each of the non-interleaved memory cores within a particular vertical strip is associated with a different memory bank.

24. The integrated circuit of claim 21 further comprising:
a column decoder; and
a plurality of column decode conductors driven by the column decoder, coupled to the plurality of sense amplifiers, and situated substantially parallel to the strip of memory cores.

25. An integrated circuit comprising:
an array of memory cores having a first dimension and a second dimension, wherein a strip of memory cores in the first dimension includes memory cores from a first bank interleaved with memory cores from a second bank, and in which the strip includes all of the memory cores in the first bank and all of the memory cores in the second bank, an in which each bank is selectable to activate or deactivate all of its memory cores;
a plurality of sense amplifiers arranged between memory cores from the first bank and memory cores from the second bank; and
column decode conductors coupled to the plurality of sense amplifiers, the column decode conductors arranged to be near memory cores of the first and second bank.

26. The integrated circuit of claim 25 wherein the first dimension includes a plurality of horizontal strips of memory cores, and the second dimension includes a plurality of vertical strips of memory cores, and each of the plurality of horizontal strips interleaves all of the memory cores from two different banks.

27. The integrated circuit of claim 26 wherein in each of the plurality of vertical strips, each memory core is from a different bank.

28. A memory device comprising:
a first bank of memory cores that are selectable together as a first group for activation or deactivation;

a second bank of memory cores that are selectable together as a second group for activation or deactivation; and a plurality of sense amplifiers shared between the first bank of memory cores and the second bank of memory cores;

wherein all of the memory cores in the first bank and all of the memory cores in the second bank are interleaved in a first horizontal strip on the memory device.

29. The memory device of claim 28 further comprising:
a plurality of horizontal strips of which the first horizontal strip is one; and
a plurality of vertical strips of memory cores, each of the plurality of vertical strips of memory cores having non-interleaved memory cores from a plurality of banks.

30. The memory device of claim 28 further comprising:
a third bank of memory cores;
a fourth bank of memory cores;
a plurality of sense amplifiers shared between the third bank of memory cores and the fourth bank of memory cores; and
wherein the third bank of memory cores and the fourth bank of memory cores are interleaved in a second horizontal strip parallel to the first horizontal strip.

31. The memory device of claim 28 further comprising pass transistors coupled to the plurality of sense amplifiers to select data from either the first bank of memory cores or the second bank of memory cores.

32. A memory device comprising:
a first bank of memory cores that are selectable together as a first group for activation or deactivation;
a second bank of memory cores that are selectable together as a second group for activation or deactivation, wherein all of the memory cores of the first bank and all of the memory cores of the second bank are interleaved in a first horizontal strip on the memory device;
a plurality of sense amplifiers shared between the first bank of cores and the second bank of cores;
a column decoder; and
a plurality of column decode conductors coupled to the column decoder and the plurality of sense amplifiers, the plurality of column decode conductors being substantially parallel to the first horizontal strip on the memory device.

33. The memory device of claim 32 further comprising:
a plurality of horizontal strips of which the first horizontal strip is one; and
a plurality of vertical strips of memory cores, each of the memory cores in a particular one of the vertical strips associated with a different bank than the other memory cores in the particular one of the vertical strips.

34. The memory device of claim 32 further comprising:
a third bank of memory cores;
a fourth bank of memory cores; and
a plurality of sense amplifiers shared between the third bank of memory cores and the fourth bank of memory cores;
wherein all of the memory cores in the third bank of memory cores and all of the memory cores in the fourth bank of memory cores are interleaved in a second horizontal strip parallel to the first horizontal strip.

35. A memory device comprising:
a plurality of memory cores physically arranged in horizontal strips and vertical strips and logically arranged into banks that share sense amplifiers, wherein each particular bank is selectable to activate or deactivate all of the memory cores associated with that particular bank, and wherein all of the memory cores arranged in a first horizontal strip alternate between a first bank and a second bank.

36. The memory device of claim 35 further comprising:
a column decoder;
column decode conductors coupled between the column decoder and the sense amplifiers shared between the first bank and the second bank; and
sense nodes coupled to the sense amplifiers, arranged substantially parallel to the column decode conductors.

37. The memory device of claim 35 wherein all of the memory cores in a second horizontal strip are arranged to alternate between a third bank and a fourth bank.

38. The integrated circuit of claim 35 wherein each of the of vertical strips includes non-interleaved memory cores from different banks.

39. A memory device comprising:
a plurality of memory cores physically arranged in horizontal strips and vertical strips and logically arranged into banks that share sense amplifiers, wherein each particular bank is selectable to activate or deactivate all of the memory cores associated with that particular bank, and wherein all of the memory cores arranged in a first horizontal strip alternate between a first bank and a second bank; and
column decode conductors arranged in the first horizontal strip to cross memory cores from only the first bank and the second bank.

40. The memory device of claim 39 further comprising:
a second horizontal strip having interleaved all of the memory cores from a third bank and a fourth bank; and
a second plurality of sense amplifiers shared between the third bank and the fourth bank.

41. The memory device of claim 39 wherein each of the vertical strips includes non-interleaved memory cores that are taken only from different banks.

42. A memory device comprising:
a plurality of memory cores physically arranged in a plurality of horizontal strips and a plurality of vertical strips and logically arranged into banks, wherein each particular bank is selectable to activate or deactivate all of the memory cores associated with that particular bank; and
wherein each horizontal strip interleaves in alternating fashion all memory cores from only two of the banks, and no two memory cores in any particular vertical strip is from the same bank.

43. The memory device of claim 42 further comprising sense amplifiers shared between memory cores in each of the plurality of horizontal strips.

44. The memory device of claim 43 further comprising column decode conductors dedicated to each horizontal strip, each column decoder conductor passing over memory cores of two banks and no more.

45. A computer system comprising:
a processor; and
a memory device coupled to the processor, the memory device including:
a plurality of horizontal strips and vertical strips of memory cores; and
a plurality of sense amplifiers positioned between memory cores within each horizontal strip, wherein every memory core is associated with a particular bank that is selectable to activate or deactivate all of the memory cores associated with that particular bank, and wherein only every other memory core within a first horizontal strip is assigned to a the same bank, and wherein each of the memory cores in the first horizontal strip are associated with one of only two of the banks, and in which two of the banks are represented by memory cores in the first horizontal strip.

46. The computer system of claim 45 wherein each sense amplifier is shared between two banks.

47. The computer system of claim 45 further comprising a memory controller coupled to the processor and the memory device.

48. A computer system comprising:
a processor; and
a memory device coupled to the processor, the memory device including:
a first bank of memory cores arranged in a first horizontal strip, wherein the memory cores of first bank are selectable together as a first group for activation or deactivation;
a second bank of memory cores interleaved with the first bank of memory cores in the first horizontal strip, wherein the memory cores of second bank are selectable together as a second group for activation or deactivation, and wherein all of the memory cores in the first and second banks are located in the first horizontal strip;
a third bank of memory cores arranged in a second horizontal strip, wherein the memory cores of third bank are selectable together as a third group for activation or deactivation; and
a fourth bank of memory cores interleaved with the third bank of memory cores in the second horizontal strip, wherein the memory cores of the fourth bank are selectable together as a fourth group for activation or deactivation, and wherein all of the memory cores in the third and fourth banks are located in the second horizontal strip.

49. The computer system of claim 48 wherein the memory device further includes:
a first plurality of sense amplifiers shared between the first bank of memory cores and the second bank of memory cores; and
a second plurality of sense amplifiers shared between the third bank of memory cores and the fourth bank of memory cores.

50. The computer system of claim 48 further comprising a memory controller coupled to the processor and the memory device.

51. A computer system comprising:
a processor; and
a memory coupled to the processor, the memory including:
a plurality of sense amplifiers;
a first bank of memory cores, each coupled to at least one of the plurality of sense amplifiers, wherein the memory cores of first bank are selectable together as a first group for activation or deactivation; and
a second bank of memory cores, each coupled to at least one of the plurality of sense amplifiers, wherein the memory cores of the second bank are selectable together as a second group for activation or deactivation;
wherein all of the memory cores of the first bank and all of the memory cores of the second bank are arranged in a strip with the plurality of sense amplifiers.

52. The computer system of claim 51 wherein the memory further includes:
column decode conductors coupled to the plurality of sense amplifiers and
a column decoder to drive the column decode conductors.

53. The computer system of claim 51 further comprising a memory controller coupled to the processor and the memory device.

54. A computer system comprising:
a processor;
a memory controller coupled to the processor; and
a memory device coupled to the memory controller, the memory device including:
a plurality of memory cores logically arranged into Rambus-compatible banks, wherein each particular bank is selectable to activate or deactivate all of the memory cores associated with that particular bank, and physically arranged into horizontal strips and vertical strips, wherein each vertical strip interleaves all of the memory cores from two different Rambus-compatible banks.

55. The computer system of claim 54 wherein the memory device includes sense amplifiers shared between memory cores of Rambus-compatible banks in each horizontal strip.

56. A multibank memory device allowing simultaneous access of some of a plurality of memory banks while suffering reduced noise in sense amplifiers, the memory device comprising:
a plurality of memory banks, each memory bank including a plurality of memory cores, the memory cores arranged in strips of comprising horizontal strips and vertical strips, wherein each particular bank is selectable to activate or deactivate all of the memory cores associated with that particular bank;
a plurality of sense amplifiers shared among the memory cores of different ones of the plurality of memory banks;
a plurality of column decoders, each column decoder exclusively accessing a horizontal strip of all of the memory cores from only two of the memory banks wherein the memory cores are separated from each other in the horizontal strip by shared sense amplifiers whereby the memory cores of the horizontal strip alternate between the two memory banks.

57. A memory architecture having n memory banks which allows simultaneous access of some of the memory banks, each memory bank including a plurality of memory cores, wherein each particular bank is selectable to activate or deactivate all of the memory cores associated with that particular bank, the memory cores arranged in horizontal strips, each horizontal strip having an associated column decoder connected to each memory core of the horizontal strip and each core of the horizontal strip associated with only one of only two memory banks.

58. A multibank memory architecture allowing simultaneous access of some of a plurality of memory banks while suffering reduced noise in sense amplifiers, the memory architecture comprising:
a plurality of memory banks, each memory bank containing a plurality of memory cores, wherein each bank is selectable to activate or deactivate all of its associated memory cores, the memory cores arranged in strips, each strip containing all memory cores of only two memory banks and the strip having cores arranged to be alternating between the two memory banks with sense amplifiers shared between the cores of the two memory banks.

59. A multibank memory architecture allowing simultaneous access of some of a plurality of memory banks, the memory architecture comprising a horizontal strip of all of the memory cores from only two of the memory banks interspersed between shared sense amplifiers, each memory core being a part of one of N memory banks, wherein each bank is selectable to activate or deactivate all of its associated memory cores, the strip having the memory cores laid out so that no two memory cores of the same memory bank share a common sense amplifier.

* * * * *

UNITED STATES PATENT AND TRADEMARK OFFICE
CERTIFICATE OF CORRECTION

PATENT NO. : 7,088,604 B2
APPLICATION NO. : 09/809586
DATED : August 8, 2006
INVENTOR(S) : Shirley et al.

It is certified that error appears in the above-identified patent and that said Letters Patent is hereby corrected as shown below:

In column 4, line 58, delete "a" before "row, and".

In column 6, line 20, in Claim 1, delete "a" before "all memory".

In column 6, line 24, in Claim 1, after "first strip" delete "row".

In column 7, line 60, in Claim 17, delete "deactive" and insert -- deactivate --, therefor.

In column 10, line 17, in Claim 38, delete "of" before "vertical strips".

In column 11, line 2, in Claim 45, delete "a" before "the same".

In column 12, line 31, in Claim 56, delete "of" before "comprising horizontal".

Signed and Sealed this

Third Day of April, 2007

JON W. DUDAS
*Director of the United States Patent and Trademark Office*